(12) United States Patent
Li

(10) Patent No.: US 11,467,639 B2
(45) Date of Patent: Oct. 11, 2022

(54) HEAT DISSIPATION ASSEMBLY AND ELECTRONIC DEVICE

(71) Applicant: BEIJING XIAOMI MOBILE SOFTWARE CO., LTD., Beijing (CN)

(72) Inventor: Zhenxu Li, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 38 days.

(21) Appl. No.: 17/019,505

(22) Filed: Sep. 14, 2020

(65) Prior Publication Data

US 2021/0181818 A1  Jun. 17, 2021

(30) Foreign Application Priority Data

Dec. 13, 2019 (CN) .......................... 201911285307.X

(51) Int. Cl.
| | |
|---|---|
| *G06F 1/20* | (2006.01) |
| *G01K 1/02* | (2021.01) |
| *F28F 27/00* | (2006.01) |
| *H05K 7/20* | (2006.01) |

(52) U.S. Cl.
CPC .............. *G06F 1/203* (2013.01); *F28F 27/00* (2013.01); *G01K 1/026* (2013.01); *G06F 1/206* (2013.01); *H05K 7/2039* (2013.01); *H05K 7/20154* (2013.01); *H05K 7/20172* (2013.01); *H05K 7/20209* (2013.01)

(58) Field of Classification Search
CPC . G06F 1/20; G06F 1/183; G06F 1/203; G06F 1/206; F28F 27/00; G01K 1/026; H05K 7/20154; H05K 7/20172; H05K 7/20209; H05K 7/2039
See application file for complete search history.

(56) References Cited

U.S. PATENT DOCUMENTS

| | | | | |
|---|---|---|---|---|
| 5,079,438 A * | 1/1992 | Heung | ............... | H05K 7/20172 307/141 |
| 5,199,385 A * | 4/1993 | Doss | ....................... | F24H 1/205 110/162 |
| 5,478,221 A | 12/1995 | Loya | | |
| 6,175,104 B1 * | 1/2001 | Greene | .................... | H05B 6/70 219/679 |

(Continued)

FOREIGN PATENT DOCUMENTS

CN           110325012 A       10/2019

OTHER PUBLICATIONS

Long Jing, Mobile terminal and heat dissipation component thereof, Oct. 11, 2019, Espacenet English translation (Year: 2019).*

(Continued)

*Primary Examiner* — Michael A Matey
(74) *Attorney, Agent, or Firm* — Syncoda LLC; Feng Ma

(57) ABSTRACT

A heat dissipation assembly can be applied to the electronic device. By providing a heat dissipation fan and a temperature sensor for the heat dissipation assembly, and arranging the heat dissipation assembly in an accommodation space defined by a processor cover plate and a control mainboard, the heat dissipation fan can improve a heat dissipation effect on the processor by utilizing air flow generated by the heat dissipation fan in the accommodation space in cooperation with heat dissipation openings in the processor cover plate.

14 Claims, 4 Drawing Sheets

(56) References Cited

U.S. PATENT DOCUMENTS

| | | | | |
|---|---|---|---|---|
| 8,120,911 | B2* | 2/2012 | Zhou | G06F 1/206 |
| | | | | 361/695 |
| 9,999,165 | B2* | 6/2018 | Cho | H05K 9/0026 |
| 10,285,306 | B1* | 5/2019 | Minkin | H05K 7/20909 |
| 2005/0209740 | A1* | 9/2005 | Vann, Jr. | G05D 23/1906 |
| | | | | 700/300 |
| 2011/0156401 | A1* | 6/2011 | Kuo | B60R 1/12 |
| | | | | 290/55 |
| 2012/0313475 | A1* | 12/2012 | Wu | F04D 25/0646 |
| | | | | 310/156.38 |
| 2019/0216281 | A1* | 7/2019 | Park | F04D 17/168 |
| 2020/0060047 | A1* | 2/2020 | Pai | H05K 7/20727 |

OTHER PUBLICATIONS

Search Report for EP application 20198124.8, dated Mar. 29, 2021.

* cited by examiner

HEAT DISSIPATION ASSEMBLY AND ELECTRONIC DEVICE

CROSS-REFERENCE TO RELATED APPLICATIONS

This application claims priority to Chinese Patent Application Serial No. 201911285307.X filed on Dec. 13, 2019, the disclosure of which is hereby incorporated by reference in its entirety.

BACKGROUND

Processors of electronic devices such as mobile phones are faced with a problem of heat emission when they are in operation. Especially in the era of 5G (5th generation mobile networks, or 5th generation wireless systems, or 5th-Generation) communication technologies of electronic devices, the power consumption and heating rate of the processors also escalate as a result of the application of 5G functions.

SUMMARY

The present disclosure relates to the field of electronic technologies, and more specifically to a heat dissipation assembly and an electronic device.

Various embodiments of the present disclosure provide a heat dissipation assembly and an electronic device, which can reduce interference of the heat dissipation assembly on internal structures of the electronic device and at the same time improve a heat dissipation effect inside the electronic device.

In a first aspect, various embodiments of the present disclosure provide a heat dissipation assembly for an electronic device. The electronic device includes a control mainboard, a processor, and a processor cover plate. The processor cover plate is provided with a plurality of heat dissipation openings through the processor cover plate. The processor is arranged on the control mainboard and received in an accommodation space defined by the processor cover plate and the control mainboard. The heat dissipation assembly is received in the accommodation space and includes a heat dissipation fan and a temperature sensor electrically coupled to the heat dissipation fan.

In a second aspect, various embodiments of the present disclosure provide an electronic device. The electronic device includes an internal mounting space and components mounted in the internal mounting space. The component includes a functional module including at least one of a camera module and a battery module, a control mainboard, a processor cover plate having a plurality of heat dissipation openings, a processor on the control mainboard and received in an accommodation space defined by the processor cover plate and the control mainboard, the accommodation space being in communication with the internal mounting space through the plurality of heat dissipation openings, and a heat dissipation assembly received in the accommodation space. The heat dissipation assembly includes: a heat dissipation fan, and a temperature sensor electrically coupled to the heat dissipation fan.

In a third aspect, various embodiments of the present disclosure provide another heat dissipation assembly for an electronic device. The electronic device includes a control mainboard, a processor cover plate having a top portion and a side portion connected to the control mainboard to define an accommodation space together with the control mainboard, at least one of the top portion and the side portion being provided with a plurality of heat dissipation openings through the processor cover plate, and a processor received in the accommodation space. The heat dissipation assembly is received in the accommodation space and includes a heat dissipation fan, and a temperature sensor electrically coupled to the heat dissipation fan.

BRIEF DESCRIPTION OF THE DRAWINGS

The accompanying drawings, which are incorporated in and constitute a part of this disclosure, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Heat dissipation for processors of electronic devices such as mobile phones can be achieved by graphite sheets and heat dissipation tubes. However, typical heat dissipation methods can cause excessive interference to the internal structure of the electronic device, and may not achieve desired heat dissipation effects.

Figure 1:
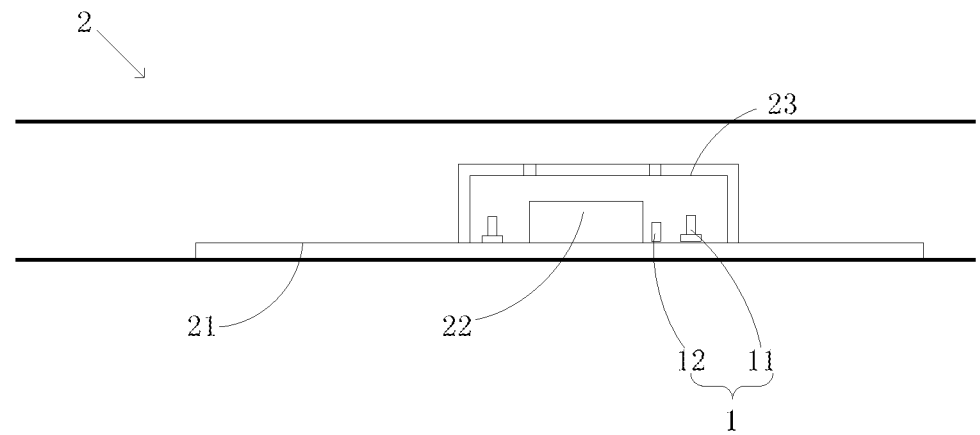
FIG. 1 is a partial sectional view of an electronic device according to some embodiments of the present disclosure.
Figure 2:
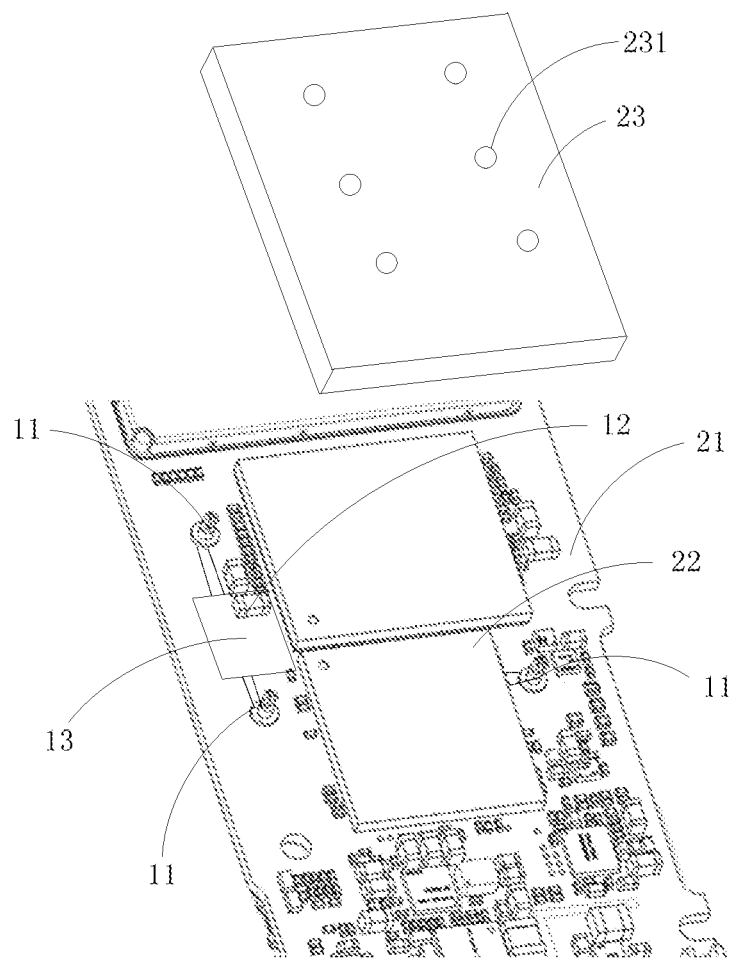
FIG. 2 is a partial exploded view of an electronic device according to some embodiments of the present disclosure.

FIG. 1 is a partial sectional view of an electronic device according to some embodiments of the present disclosure. FIG. 2 is a partial exploded view of an electronic device according to some embodiments of the present disclosure. As shown in FIGS. 1 and 2, a heat dissipation assembly 1 is applied to an electronic device 2. The electronic device 2 includes a control mainboard 21, a processor 22, and a processor cover plate 23. The processor 22 is arranged on the control mainboard 21 and received in an accommodation space defined by the processor cover plate 23 and the control mainboard 21. The heat dissipation assembly 1 includes a heat dissipation fan 11 and a temperature sensor 12 electrically coupled to the heat dissipation fan 11. The heat dissipation assembly 1 is received in the accommodation space. The processor cover plate 23 is provided with a plurality of heat dissipation openings 231 through the processor cover plate 23.

By providing the heat dissipation fan 11 and the temperature sensor 12 for the heat dissipation assembly 1, and arranging the heat dissipation assembly 1 in the accommodation space defined by the processor cover plate 23 and the control mainboard 21, the heat dissipation fan 11 can dissipate the heat generated by the processor 22 out of the accommodation space by air flow produced by the heat dissipation fan in the accommodation space in cooperation with the heat dissipation openings 231 in the processor cover plate 23, so as to prevent local overheat of the processor 22 and improve a heat dissipation effect on the processor 22. In addition, the arrangement of the heat dissipation assembly 1 in the accommodation space reduces the leakage of operating noise of the heat dissipation fan 11 and avoids the interference of the heat dissipation assembly 1 with other internal structures of the electronic device 2. Moreover, the temperature sensor 12 can monitor a temperature of the processor 22 to make the heat dissipation fan 11 to start or stop according to the temperature sensed by the temperature sensor 12, such that the working time and noise interference of the heat dissipation fan 11 can be reduced while the heat dissipation effect is guaranteed.

In an embodiment, as shown in FIG. 2, the control mainboard 21 is provided with a heat dissipation control circuit 13. The heat dissipation fan 11 and the temperature sensor 12 are disposed on the control mainboard 21 and electrically coupled to the heat dissipation control circuit 13. The heat dissipation fan 11 and the temperature sensor 12 are directly controlled by the heat dissipation control circuit 13 on the control mainboard 21, which avoids the need to provide an extra heat dissipation control circuit board for the heat dissipation assembly 1 and simplifies the electrical connection relationship between the heat dissipation fan 11 and the temperature sensor 12. Hence, it is beneficial to improving the convenience of control over the heat dissipation assembly 1. A process for controlling the heat dissipation fan 11 by the heat dissipation control circuit 13 may include that when the temperature monitored by the temperature sensor 12 reaches a preset value, the heat dissipation control circuit 13 controls the heat dissipation fan 11 to start; and when the temperature monitored by the temperature sensor 12 is lower than the preset value, the heat dissipation control circuit 13 controls the heat dissipation fan 11 to stop.

Further, the heat dissipation fan 11 may include an electrode pad 115 welded onto the control mainboard 21 by the surface mounting technology (SMT), which is simple in process, easy to implement, and suitable for mass production. The electrode pad 115 may be arranged at a bottom of the heat dissipation fan 11 to facilitate the welding operation between the electrode pad 115 and the control mainboard 21.

In another embodiment, the heat dissipation assembly 1 further includes a heat dissipation control circuit board (not labeled). The heat dissipation fan 11 and the temperature sensor 12 are arranged on the heat dissipation control circuit board that is independent of the control mainboard 21 of the electronic device 2, to form a modular heat dissipation assembly 1. During an assembling process, it is only necessary to mount the modular heat dissipation assembly 1 on the control mainboard 21 of the electronic device 2, which boosts the integration and installation convenience of the heat dissipation assembly 1.

Figure 3:
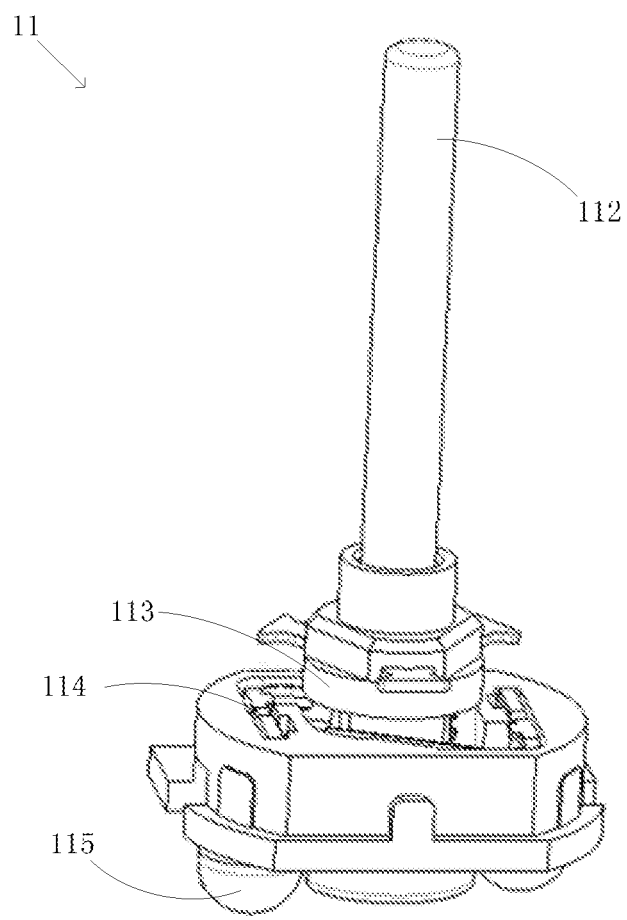
FIG. 3 is a partial schematic view of a heat dissipation fan according to some embodiments of the present disclosure.
Figure 4:
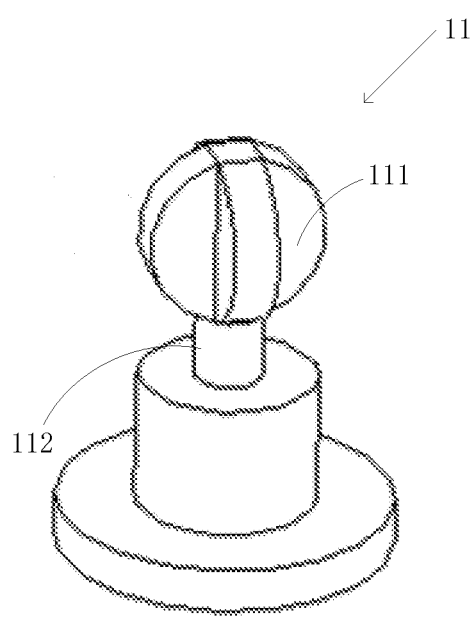
FIG. 4 is a perspective view of a heat dissipation fan according to some embodiments of the present disclosure.

In the above embodiment, as shown in FIGS. 3 and 4, the heat dissipation fan 11 may include a fan blade 111, a rotor 112, a magnet 113, and a brush 114. The fan blade 111 is mounted to the rotor 112, and the rotor 112 is mounted to the brush 114. The brush 114 is arranged in a magnetic field generated by the magnet 113 and is electrically coupled to the heat dissipation control circuit 13. The energization control over the brush 114 by the heat dissipation control circuit 13 can drive the rotor 112 and the fan blade 111 to rotate, and the de-energization control over the brush 114 by the heat dissipation control circuit 13 can cause the rotor 112 and the fan blade 111 to stop rotating. The magnet 113 may be an electromagnet or a permanent magnet, which is not limited in the present disclosure. When the magnet 113 is an electromagnet, the electromagnet is electrically coupled to the heat dissipation control circuit 13, and the generation and disappearance of the magnetic field are controlled by the heat dissipation control circuit 13, which can also control the rotation and stop of the brush 114. Since the brush 114 can rotate in the magnetic field after being energized, the rotor 112 mounted on the brush 114 and the fan blade 111 mounted on the rotor 112 can be brought into rotation. The rotation of the fan blade 111 can generate air flow in the accommodation space, so as to take away the heat in the accommodation space through the heat dissipation openings 231.

The above heat dissipation fan 11 has a small volume and high structural accuracy, and occupies little space. The rotation of the fan blade 111 can generate air flow, achieving a better heat dissipation effect. It should be noted that the number of fan blades 111 may be two, three, four or more, which is not limited in the present disclosure. In particular, when the number of fan blades 111 is four and the four fan blades are evenly distributed along a circumferential direction of the rotor 112, a better heat dissipation effect can be achieved.

The arrangement and cooperation of the heat dissipation fan 11 and the temperature sensor 12 will be further exemplarily elaborated below.

Figure 5:
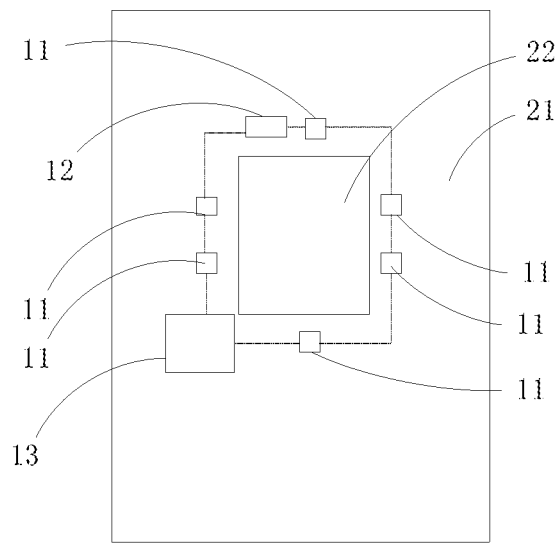
FIG. 5 is a partial structural diagram of an electronic device according to some embodiments of the present disclosure.

In an embodiment, as shown in FIG. 5, the heat dissipation assembly 1 includes a plurality of heat dissipation fans 11, and the plurality of heat dissipation fans 11 are arranged around the processor 22. The plurality of heat dissipation fans 11 not only increases the amount of air flow in the accommodation space, but also provides heat dissipation for different areas of the processor 22 in different orientations of the processor 22, such that the heat dissipation for the processor 22 is uniform and effective.

Further, the heat dissipation assembly 1 includes at least one temperature sensor 12, and each temperature sensor 12 is connected in series with at least one heat dissipation fan 11 to make the heat dissipation fan 11 connected in series with the temperature sensor 12 to start or stop.

For example, as shown in FIG. 5, when the heat dissipation assembly 1 includes one temperature sensor 12, the temperature sensor 12 is connected in series with all the heat dissipation fans 11. When a temperature monitored by the temperature sensor 12 is greater than a preset value, all the heat dissipation fans 11 are controlled to start; and when the temperature monitored by the temperature sensor 12 is lower than the preset value, all the heat dissipation fans 11 are controlled to stop. The above control process is simple, and easy to manipulate and realize.

Alternatively, when the heat dissipation assembly 1 includes one temperature sensor 12, the temperature sensor 12 is connected in series with all three heat dissipation fans 11. When a temperature monitored by the temperature sensor 12 is greater than a first preset value, one heat dissipation fan 11 is controlled to start and the other two heat dissipation fans 11 are controlled to stop; when the temperature monitored by the temperature sensor 12 is greater than a second preset value, two heat dissipation fans 11 are controlled to start and the other one heat dissipation fan 11 is controlled to stop; and when the temperature monitored by the temperature sensor 12 is greater than a third preset value, all three heat dissipation fans 11 are controlled to start. The first preset value is less than the second preset value, and the second preset value is less than the third preset value. That is, more heat dissipation fans 11 are controlled to start as the temperature monitored by the temperature sensor 12 becomes higher, so as to improve the heat dissipation effect for the current temperature, and avoid resource waste and working noise interference caused by turning on too many heat dissipation fans 11 when the temperature is relatively low.

Figure 6:
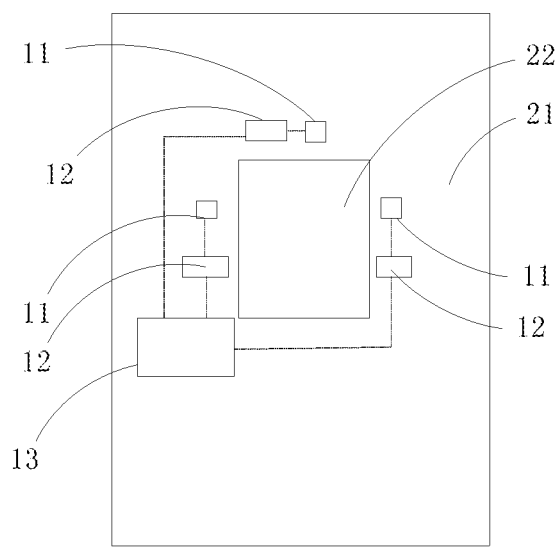
FIG. 6 is a partial structural diagram of an electronic device according to another exemplary embodiment of the present disclosure.

Alternatively, as shown in FIG. 6, when the heat dissipation assembly 1 includes a plurality of temperature sensors 12 arranged in different orientations of the processor 22 and connected in parallel, each temperature sensor 12 is connected in series with at least one heat dissipation fan 11, and the temperature sensor 12 and the at least one heat dissipation fan 11 serially connected with it are arranged in the same orientation of the processor 22. When the temperature monitored by one or more of the temperature sensors 12 is greater than a preset value, the heat dissipation fan 11 connected in series with the corresponding temperature sensor 12 is controlled to start; and when the temperature monitored by the corresponding temperature sensor 12 is lower than the preset value, the heat dissipation fan 11 connected in series with the corresponding temperature sensor 12 is controlled to stop. The plurality of temperature sensors 12 control the heat dissipation fans 11 located in different orientations of the processor 22 correspondingly, such that the heat dissipation assembly 1 can monitor and reduce the temperature of different areas of the processor 22, which improves the overall heat dissipation effect of the processor 22.

The arrangement of the heat dissipation openings 231 according to some embodiments will be elaborated below.

Figure 7:
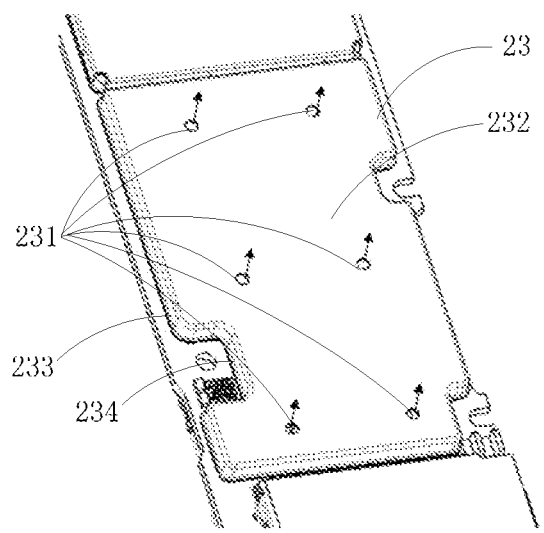
FIG. 7 is a schematic view of cooperation between a processor cover plate and a control mainboard according to some embodiments of the present disclosure.

In an embodiment, as shown in FIG. 7, the processor cover plate 23 includes a top portion 232 located above the processor 22, and a plurality of heat dissipation openings 231 are provided in the top portion 232. The above structural arrangement enables hot air in the accommodation space to be discharged through the top portion 232 of the processor cover plate 23, facilitating air flow, and boosting the heat dissipation efficiency.

Further, the heat dissipation openings 231 are evenly distributed in the top portion 232 to improve the uniformity of heat dissipation in various areas of the processor 22.

Figure 8:
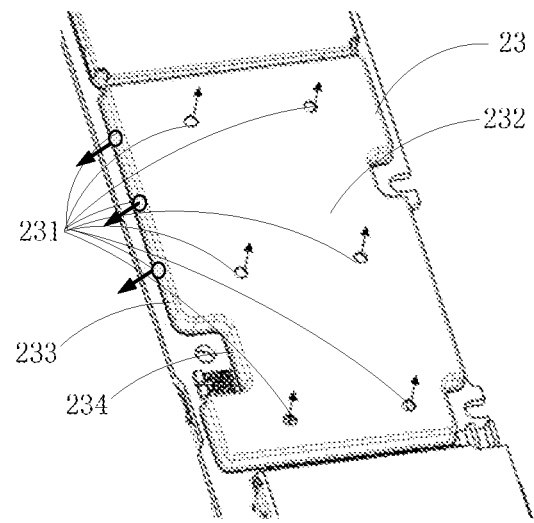
FIG. 8 is a schematic view of cooperation between a processor cover plate and a control mainboard according to another exemplary embodiment of the present disclosure.

In another embodiment, as shown in FIG. 8, the processor cover plate 23 includes a top portion 232 located above the processor 22 and a side portion 233 fitted to the control mainboard 21. A plurality of heat dissipation openings 231 is provided in the top portion 232, and a plurality of heat dissipation openings 231 is provided in the side portion 233. The heat dissipation openings 231 additionally provided in the side portion 233 of the processor cover plate 23 can accelerate the air flow in the accommodation space and improve the heat dissipation effect.

The shape of the heat dissipation opening 231 may be a circle, a rectangle, a triangle, or other shapes, which is not limited in the present disclosure.

In addition, the processor cover plate 23 may also include an avoiding portion 234. When the processor cover plate 23 is mounted on the control mainboard 21, the structure of the avoiding portion 234 can evade other electronic components on the control mainboard 21, thereby avoiding mutual interference between the processor cover plate 23 and the electronic components on the control mainboard 21.

Figure 9:
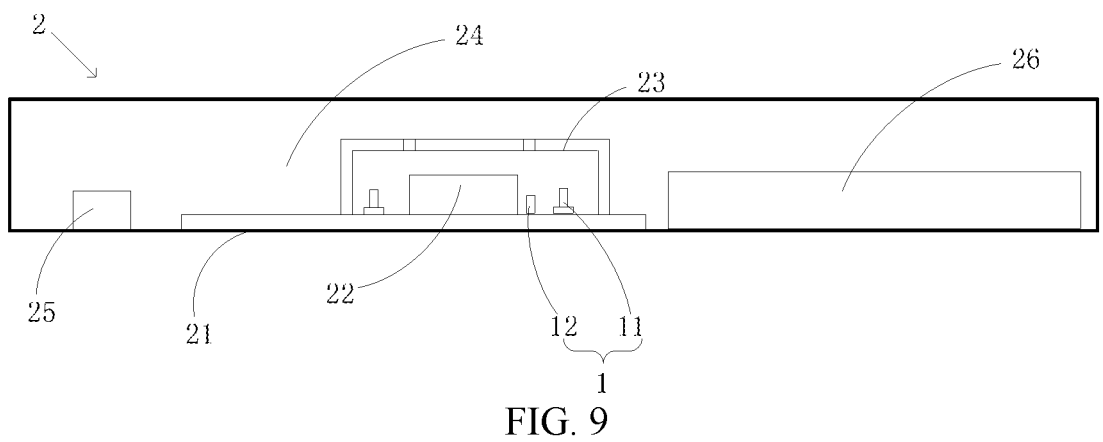
FIG. 9 is a sectional view of an electronic device according to some embodiments of the present disclosure.

Various embodiments of the present disclosure further provide an electronic device. As shown in FIG. 9, the electronic device 2 includes an internal mounting space 24 and a functional module, a control mainboard 21, a processor 22, a processor cover plate 23, and the above heat dissipation assembly 1, all of which are mounted in the internal mounting space 24. The accommodation space and the internal mounting space 24 are communicated with each other through heat dissipation openings 231 in the processor cover plate 23. The functional module may include at least one of a camera module 25 and a battery module 26.

Since the internal mounting space 24 of the electronic device 2 is in communication with the accommodation space, when the air is discharged through the heat dissipation opening 231, the air flow in the internal mounting space 24 is also accelerated, which is beneficial to heat dissipation for the functional module such as the camera module 25 and the battery module 26.

By providing the heat dissipation fan 11 and the temperature sensor 12 for the heat dissipation assembly 1, and arranging the heat dissipation assembly 1 in the accommodation space defined by the processor cover plate 23 and the control mainboard 21, the heat dissipation fan 11 can improve the heat dissipation effect on the processor 22 by utilizing the air flow generated by the heat dissipation fan in the accommodation space in cooperation with the heat dissipation openings 231 in the processor cover plate 23. In addition, the arrangement of the heat dissipation assembly 1 in the accommodation space reduces the leakage of operating noise of the heat dissipation fan 11 and avoids the interference of the heat dissipation assembly 1 with other internal structures of the electronic device 2. Moreover, the temperature sensor 12 can monitor the temperature of the processor 22 to make the heat dissipation fan 11 to start or stop according to the temperature sensed by the temperature sensor 12, such that the working time and noise interference of the heat dissipation fan 11 can be reduced while the heat dissipation effect is guaranteed.

It should be noted that the electronic device 2 may be a mobile phone, a tablet computer, a vehicle-mounted terminal or a medical terminal, which is not limited in the present disclosure.

One of ordinary skill in the art will understand that the above described modules/units can each be implemented by hardware, or software, or a combination of hardware and software. One of ordinary skill in the art will also understand that multiple ones of the above described modules/units may be combined as one module/unit, and each of the above described modules/units may be further divided into a plurality of sub-modules/sub-units.

The various device components, modules, units, blocks, or portions may have modular configurations, or are composed of discrete components, but nonetheless can be referred to as "modules" in general. In other words, the "components," modules," "blocks," "portions," or "units" referred to herein may or may not be in modular forms, and these phrases may be interchangeably used.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures.

A computer program (also known as a program, software, software application, app, script, or code) can be written in any form of programming language, including compiled or interpreted languages, declarative or procedural languages, and it can be deployed in any form, including as a stand-alone program or as a portion, component, subroutine, object, or other portion suitable for use in a computing environment. A computer program can, but need not, correspond to a file in a file system. A program can be stored in a portion of a file that holds other programs or data (e.g., one or more scripts stored in a mark-up language document), in a single file dedicated to the program in question, or in multiple coordinated files (e.g., files that store one or more portions, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode), or any other monitor for displaying information to the user and a keyboard, a pointing device, e.g., a mouse, trackball, etc., or a touch screen, touch pad, etc., by which the user can provide input to the computer.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components.

The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

What is claimed is:

1. A heat dissipation assembly for an electronic device, the electronic device comprising a control mainboard, a processor, and a processor cover plate provided with a plurality of heat dissipation openings through the processor cover plate, the processor being arranged on the control mainboard and received in an accommodation space defined by the processor cover plate and the control mainboard, the heat dissipation assembly being received in the accommodation space and comprising:
a plurality of heat dissipation fans arranged in different orientations of the processor, and
a plurality of temperature sensors connected in parallel, and each of the plurality of temperature sensors being connected in series with at least one of the plurality of heat dissipation fans, to control the at least one of the plurality of heat dissipation fans connected in series with each of the plurality of temperature sensors to start or stop, wherein the temperature sensor and the at least one heat dissipation fan serially connected with it are arranged in a same orientation of the processor.

2. The heat dissipation assembly according to claim 1, wherein the control mainboard is provided with a heat dissipation control circuit, and the plurality of heat dissipation fans and the plurality of temperature sensors are arranged on the control mainboard and electrically coupled to the heat dissipation control circuit.

3. The heat dissipation assembly according to claim 2, wherein the plurality of heat dissipation fans comprises an electrode pad welded to the control mainboard by a surface mounting technology.

4. The heat dissipation assembly according to claim 1, wherein the plurality of heat dissipation fans comprises a fan blade, a rotor, a magnet, and a brush; the fan blade is mounted to the rotor, and the rotor is mounted on the brush; and the brush is arranged in a magnetic field generated by the magnet and drives the rotor and the fan blade to rotate after being energized.

5. The heat dissipation assembly according to claim 1, wherein the processor cover plate comprises a top portion located above the processor, and the plurality of heat dissipation openings are provided in the top portion.

6. The heat dissipation assembly according to claim 5, wherein the plurality of heat dissipation openings are evenly distributed in the top portion.

7. The heat dissipation assembly according to claim 5, wherein the processor cover plate further comprises a side portion fitted to the control mainboard, and the plurality of heat dissipation openings are provided in the side portion.

8. The electronic device comprising the heat dissipation assembly according to claim 1, further comprising:
the control mainboard;
the processor; and
the processor cover plate provided with the plurality of heat dissipation openings through the processor cover plate, the processor being arranged on the control mainboard and received in the accommodation space defined by the processor cover plate and the control mainboard,
wherein
by arranging the heat dissipation assembly in the accommodation space defined by the processor cover plate and the control mainboard, the plurality of heat dissipation fans are configured to dissipate the heat generated by the processor out of the accommodation space by air flow produced by the plurality of heat dissipation fans in the accommodation space in cooperation with the plurality of heat dissipation openings in the processor cover plate, thereby preventing local overheat of the processor and improving a heat dissipation effect on the processor; and
the arrangement of the heat dissipation assembly in the accommodation space is configured to reduce leakage of operating noise of the plurality of heat dissipation fans and avoid interference of the heat dissipation assembly with other internal structures of the electronic device;
the plurality of temperature sensors are configured to monitor a temperature of the processor to facilitate controlling the plurality of heat dissipation fans to start or stop according to the monitored temperature, thereby reducing running time and noise interference of the plurality of heat dissipation fans while guaranteeing heat dissipation.

9. An electronic device, comprising:
an internal mounting space; and
components mounted in the internal mounting space and comprising:
a functional module comprising at least one of a camera module and a battery module,
a control mainboard,
a processor cover plate having a plurality of heat dissipation openings,
a processor on the control mainboard and received in an accommodation space defined by the processor cover plate and the control mainboard, the accommodation space being in communication with the internal mounting space through the plurality of heat dissipation openings, and
a heat dissipation assembly received in the accommodation space and comprising:
a plurality of heat dissipation fans arranged in different orientations of the processor, and
a plurality of temperature sensors connected in parallel, and each of the plurality of temperature sensors being connected in series with at least one of the plurality of heat dissipation fans, to control the at least one of the plurality of heat dissipation fans connected in series with each of the plurality of temperature sensors to start or stop, wherein the temperature sensor and the at least one heat dissipation fan serially connected with it are arranged in a same orientation of the processor.

10. The electronic device according to claim 9, wherein the control mainboard is provided with a heat dissipation control circuit, and the plurality of heat dissipation fans and the plurality of temperature sensors are arranged on the control mainboard and electrically coupled to the heat dissipation control circuit.

11. The electronic device according to claim 10, wherein the heat dissipation fan comprises an electrode pad welded to the control mainboard by a surface mounting technology.

12. The electronic device according to claim 9, wherein the plurality of heat dissipation fans comprises a fan blade, a rotor, a magnet, and a brush; the fan blade is mounted to the rotor, and the rotor is mounted on the brush; and the brush is arranged in a magnetic field generated by the magnet and drives the rotor and the fan blade to rotate after being energized.

13. A heat dissipation assembly for an electronic device, the electronic device comprising:
a control mainboard,
a processor cover plate having a top portion and a side portion connected to the control mainboard to define an accommodation space together with the control mainboard, at least one of the top portion and the side portion being provided with a plurality of heat dissipation openings through the processor cover plate, and
a processor received in the accommodation space; and
the heat dissipation assembly being received in the accommodation space and comprising:
a plurality of heat dissipation fans arranged in different orientations of the processor, and
a plurality of temperature sensors connected in parallel, and each of the plurality of temperature sensors being connected in series with at least one of the plurality of heat dissipation fans, to control the at least one of the plurality of heat dissipation fans connected in series with each of the plurality of temperature sensors to start or stop, wherein the temperature sensor and the at least one heat dissipation fan serially connected with it are arranged in a same orientation of the processor.

14. The heat dissipation assembly according to claim 13, wherein the plurality of heat dissipation fans comprises:
a rotor having a first end and a second end opposite each other,
a fan blade mounted to the first end,
a magnet mounted to the second end, and
a brush connected to the rotor and arranged within a magnetic field generated by the magnet; and
wherein the control mainboard is provided with a heat dissipation control circuit, and the plurality of heat dissipation fans and the plurality of temperature sensors are arranged on the control mainboard and electrically coupled to the heat dissipation control circuit, and the brush drives the rotor and the fan blade to rotate after being energized.

* * * * *